… …

United States Patent [19]

Dosch et al.

[11] Patent Number: 5,347,870
[45] Date of Patent: Sep. 20, 1994

[54] DUAL FUNCTION SYSTEM HAVING A PIEZOELECTRIC ELEMENT

[75] Inventors: Jeffrey J. Dosch, Buffalo; Roger W. Mayne, Williamsville; Daniel J. Inman, Getzville, all of N.Y.

[73] Assignee: State University of New York, Buffalo, N.Y.

[21] Appl. No.: 155,347

[22] Filed: Nov. 22, 1993

Related U.S. Application Data

[63] Continuation of Ser. No. 827,673, Jan. 29, 1992, abandoned.

[51] Int. Cl.⁵ ............................................. G01B 7/16
[52] U.S. Cl. ................................. 73/769; 310/319
[58] Field of Search ............ 73/769, 774, 775, 862.68, 73/DIG. 4; 310/316, 318, 319, 338

[56] References Cited

U.S. PATENT DOCUMENTS

| | | | |
|---|---|---|---|
| 2,137,852 | 11/1938 | Nicolson | 310/318 |
| 4,577,510 | 3/1986 | Bur et al. | 73/DIG. 4 |
| 4,597,288 | 7/1986 | Kyogoku et al. | 310/318 |
| 4,823,117 | 4/1989 | Burcham | 310/338 |
| 5,168,758 | 12/1992 | Wolfer | 73/774 |

FOREIGN PATENT DOCUMENTS 2122746 1/1984 United Kingdom ................ 310/338

Primary Examiner—Robert Raevis
Attorney, Agent, or Firm—M. Lukacher

[57] ABSTRACT

Self sensing actuator system using a piezoelectric actuator device allows the device to perform both as an actuator and sensor. The sensor functions can be either measurements of stress or measurements of strain. The actuator can be used as a force generator or positioning device, both in open and closed loop configurations, and is useful for purposes ranging from dynamic damping to shape control (i.e., shaping or controlling deformation of a body).

16 Claims, 4 Drawing Sheets

DUAL FUNCTION SYSTEM HAVING A PIEZOELECTRIC ELEMENT

This is a continuation, of application Ser. No. 827,673, filed Jan. 29, 1992, now abandon.

DESCRIPTION

1. Field of the Invention

The present invention relates to a system having a piezoelectric element and circuits used in conjunction therewith which enables the element to provide dual functions as actuator device and a sensor, and is especially useful in self sensing with respect to either stress or strain.

2. Background

It is common practice for piezoelectric sensor manufacturers to use a voltage model (equivalent circuit) of the piezoelectric device to describe both its dielectric and piezoelectric properties. As shown in FIG. 1 the model consists of: a voltage generator 1 which accounts for the piezoelectric properties, whose voltage output magnitude is proportional to the stress or strain of the piezoelectric element, and a capacitance 2 which accounts for the dielectric properties of the material and whose capacitance is equivalent to the capacitance of the modeled device. Such a model can be found in the literature provided by manufacturers of piezoelectric material; e.g. KYNAR PIEZO FILM, Technical Manual, PENNWALT CORP. P.O. Box 799, Valley Forge, PA 19482 (1987). When a piezoelectric material is attached to a structure the strain in the structure will in turn produce a strain in the piezoelectric element providing a sensor function.

One method of using a piezoelectric device as either a sensor of stress or as a sensor of strain is shown in FIG. 2, wherein the piezoelectric device is connected in a circuit with a resistor 5 and to a voltage follower, which is shown as an operational amplifier 4 with a direct feedback path. The resistor 5 is connected to ground. For small resistance values of resistor 5, that resistor in conjunction with its capacitance 2 acts as a differentiator. This circuit thus provides a rate of strain or rate of stress sensing function. When the value of resistor 5 is large, it effectively creates an open circuit to ground.

Another method of using the piezoelectric device, as a sensor capable of stress measurements or strain measurements, is shown in FIG. 3 wherein the piezoelectric element 3 is connected to an integrator (also known as a charge amplifier), which may have gain and high input resistance, consisting of an operational amplifier 4 with a capacitor 6 in its feedback path. Alternatively, a rate of strain sensor or a rate of stress sensor is obtained by replacing the capacitor 6 in FIG. 3 with a resistor device to create a current amplifier.

When a piezoelectric device is attached to a structure and a voltage is applied across said device, the stress in the piezoelectric device functions as an actuator which produces stress in or motion of the structure. The electrical circuit of a piezoelectric actuator is shown in FIG. 4, wherein the piezoelectric device includes a body of piezoelectric material 25, which is sandwiched between electrodes 24 and 26, respectively connected to an actuation voltage source 7 and ground 8. The actuation voltage 7 causes a strain or a stress in the piezoelectric material body 25.

Many applications require both actuators and sensors. Actuators are required to position a structure (called shape control in that the shape of the structure may be altered to bring it to a desired position) or to apply forces to actively damp vibrations in the structure. Sensors are required to measure the motion of a structure or measure forces within a structure, for open loop monitoring or for closed loop feedback to an actuator. Such applications have heretofore involved two separate, dedicated purpose devices, one performing the actuating function and the other the sensing function. However, this conventional methodology has disadvantages. For example, electrical interference or noise can arise between the sensor and actuator, the sensor and actuator may not be collocated which will lead to instability in many closed loop control applications, and the increase in the number of elements for dedicated sensing and actuation circuitry gives rise to complexity of design.

SUMMARY

It is the principal object of the invention to provide an improved system using a single piezoelectric element which may itself be of conventional design for providing dual functions of sensing and actuating.

A further object of this invention is to provide an improved dual function system having a piezoelectric element wherein interference as can result from the use of separate piezoelectric devices is reduced and sensing accuracy enhanced and stability of closed loop control is also enhanced due to collocation of sensor and actuator; and design complexity is reduced with the result that reliability is increased.

Another object of the invention is to provide an improved system having a piezoelectric device wherein the device is self sensing of the actuating effect, it itself produces, whether displacement, velocity or acceleration, and simultaneously actuates, and senses such displacement or motion resulting from actuation.

Another advantage of this invention is that it can be adapted to existing piezoelectric actuators whether on structures or objects to allow accurate and simultaneous monitoring of stress or strain.

Briefly described, a dual function system in accordance with an embodiment of the invention has a bridge circuit in which a single piezoelectric device is connected. The device may be mounted on a structure for simultaneously actuating the structure and for sensing the response (motion or displacement) of that structure. The bridge circuit is operative to subtract an applied voltage from the total output voltage signal across the device, leaving only the voltage due to stress or strain of the piezoelectric device. Stress and strain effects are referred to herein generically as mechanical effects. This stress or strain on the device is, in turn, related to the stress or strain of the structure being actuated by the piezoelectric device.

The foregoing and other objects and advantages of the invention will become apparent from a reading of the following descriptions and more reference to the accompany drawings wherein like reference numerals refer to like parts.

DETAILED DESCRIPTION

Figure 1:
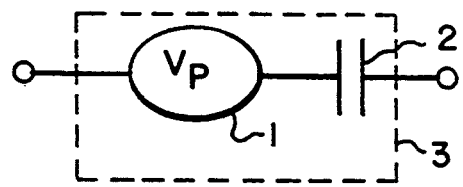
FIG. 1 is a schematic diagram of an equivalent circuit of the piezoelectric sensor.
Figure 2:
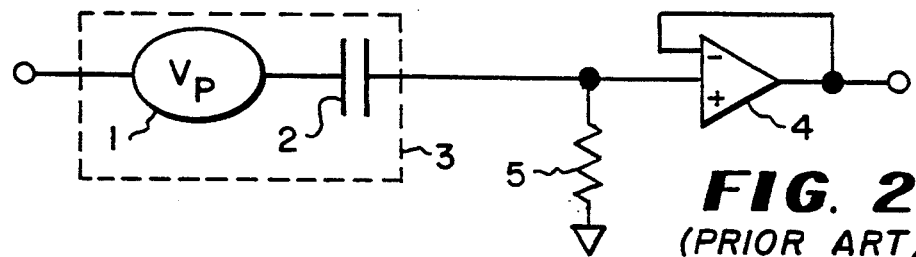
FIG. 2 is a schematic diagram of a piezoelectric sensor circuit with a voltage follower.
Figure 3:
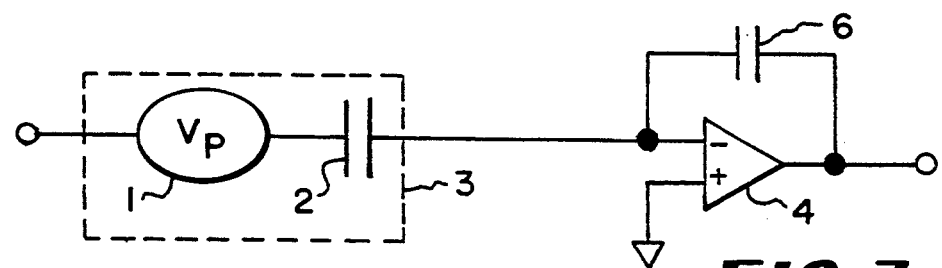
FIG. 3 is a schematic diagram of a piezoelectric sensor circuit with an integrating (or charge) amplifier.

As shown in FIG. 1 in order to construct a self sensing actuator circuit in accordance with the invention, it is necessary to determine the internal capacitance 2 of the piezoelectric device 3. The value for internal capacitance 2 can either be defined as capacitance measured at constant strain or capacitance measured at constant stress. One method for determining constant strain capacitance is to calculate this capacitance from the constant strain dielectric constant supplied by the manufacturer in the following manner: divide the product of the electrode area and the dielectric constant by the piezoelectric material thickness. One method for calculating the constant stress capacitance is to calculate this value from the constant stress dielectric constant supplied by the manufacturer of the piezoelectric device. The constant stress capacitance is the product of the electrode area and the constant stress dielectric constant divided by piezoelectric material thickness. Since the response of the system provided by the invention depends upon the internal capacitance of the device, it is desirable to select a device having a value which is lower for rate (motion) sensing than for displacement (stress/strain) sensing.

Figure 5:
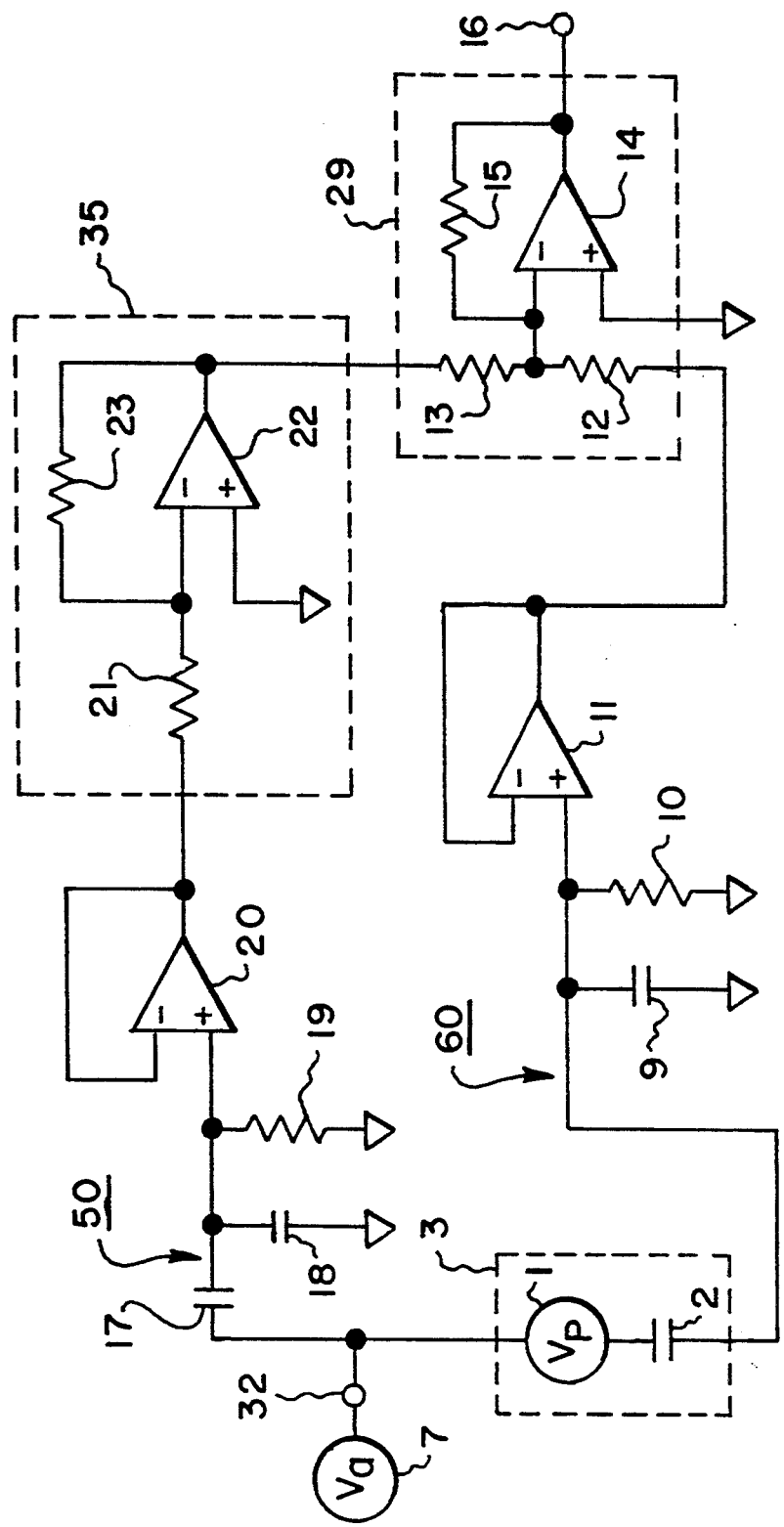
FIG. 5 is a schematic diagram of a dual function system having a piezoelectric element, in accordance with an embodiment of this invention, specifically in a self-sensing circuit utilizing voltage followers for voltage measurement.

The system shown in FIG. 5 provides dual actuation and sensing functions. The piezoelectric element (device) is self sensing in this system. An actuation voltage signal Va is applied to a reference leg 50 and a primary leg 60 of a bridge from an actuation voltage signal source 7. The voltage Va is of sufficient magnitude to produce the desired actuation of the piezoelectric device 3, and is applied to input point 32 which provides a branched signal output. The signal passed through the primary leg 60 having capacitor 9, resistor 10, operational amplifier 11, and terminating in summing junction 29. The summing junction 29 is comprised of resistors 12 and 13, operational amplifier 14 and feedback resistor 15. The operational amplifiers 20 and 11 are selected to have higher input impedance so as to be compatible with the impedance presented by the piezoelectric element 3 and the capacitive voltage dividers 17, 18 and 2, 9 when used. Actuation voltage signal 7, applied at input point 32, is also applied to the reference leg 50 comprised of reference capacitor 17, capacitor 18, resistor 19, operational amplifier 20, and signal inverter 35. The leg 50 terminates at the summing junction 29. The signal inverter 35 is comprised of resistor 21, operational amplifier 22 and feedback resistor 23.

Consider the operation of the self sensing actuator system of FIG. 5. The voltage signal transmitted by the primary leg 60 represents a contribution from both the actuation voltage 7 and the voltage Vp generated by the piezoelectric material. The voltage signal transmitted by the reference leg 50 represents a contribution from only the actuation voltage 7. The voltage produced by the piezoelectric device is proportional to the strain of the material. Because Va is subtracted from Vp at the summing junction 29, the output signal available at 16 represents contribution due only to the voltage produced by the piezoelectric material. Thus, this output signal represents the strain of the piezoelectric device.

The values of the individual components in the above mentioned self sensing piezoelectric actuator system are desirably selected so that the output voltage at the output point accurately reflects the strain. The capacitance of 17 is chosen to equal the calculated internal constant strain capacitance of the piezoelectric device 3. Capacitors 9 and 18 form AC voltage dividers with capacitances 2 and 17, respectively. The capacitor values of 9 and 18 are chosen so as to attenuate the transmitted voltage signal so as not to exceed the voltage limits of the voltage follower operational amplifiers 11 and 20. The resistors 10 and 19 are chosen such that the frequency corresponding to the reciprocal of the time constants 1/RC of resistor/capacitor pairs 10/9 and 19/18 are large compared to the measured frequency of interest.

For example, if element 3 is attached to a structure oscillating at a frequency of 10 hertz, then 10 hertz can be assumed to be a frequency of interest for purposes of determining the values of resistors 10 and 19. The values of resistance and capacitance of the resistor capacitor pairs 10/9 and 19/18 would, for this example, be chosen as follows: given that the piezoelectric device is attached to a structure vibrating at 10 Hertz and the signal frequency of the voltage from the equivalent piezoelectric voltage generator 1 is 10 hertz; then the 1/RC frequency for the above mentioned resistor capacitor pairs, should be greater than or equal to 100 hertz. The resistors 10 and 19 should not be so large that there is DC drift at the inputs to the operational amplifiers 11 and 20. Suitable operational amplifiers 11, 20, 22, 14 which may be used in this self sensing actuator system are those made by National Semiconductor, their model number LM 348N. Resistance values for resistors 21, 23, 13, 12, 15 are chosen to provide unity gains in the inverter 35 and the summer 29. In all cases the values of all components and the gain of the amplifiers is adjusted (unless unity) so that the bridge formed by the legs 50 and 60 is balanced or provides a certain voltage offset when a calibrating value of Va is applied.

Figure 4:
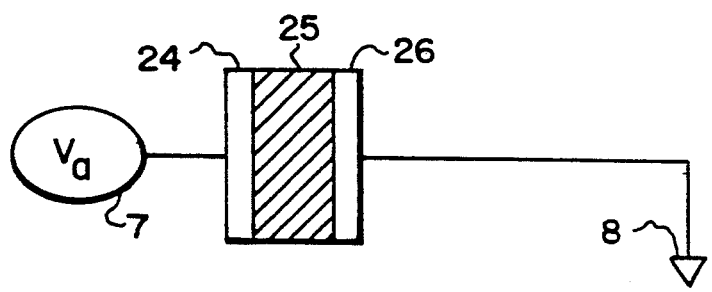
FIG. 4 is a schematic diagram showing a piezoelectric actuator circuit.
Figure 6:
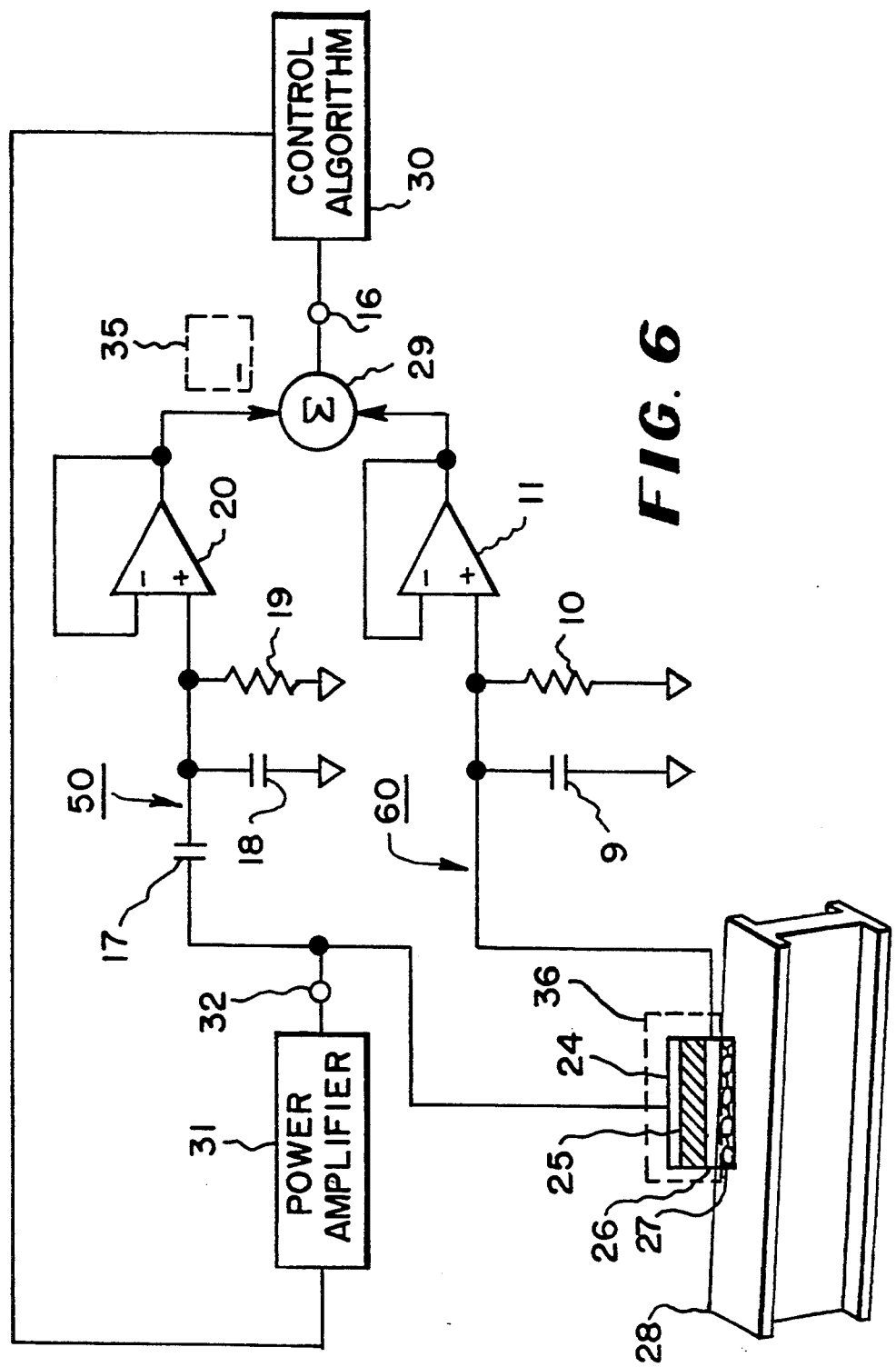
FIG. 6 is a schematic diagram of a dual function system, in accordance with another embodiment of the invention, specifically in a self-sensing circuit with a closed loop control on a beam for either shape control or vibration suppression.

FIG. 6 illustrates a self sensing actuator system embodying the invention in a closed loop configuration. A piezoelectric device 36 of the type shown on FIG. 4 is mounted on a structure (a beam being illustrated). The actuation voltage signal is applied at a point 32 by a power amplifier 31 and is of sufficient magnitude and frequency to produce the desired actuation of the piezoelectric device 36. The actuation voltage is applied to the primary leg 60 at electrode 24 which is in intimate contact with piezoelectric material 25, which is in turn in intimate contact with second electrode 26, which is in turn mechanically attached to beam 28 by means of glue layer 27. The remainder of the primary leg consists of capacitor 9, resistor 10, operational amplifier 11, and terminates at the summing junction 29. The reference leg 50, with capacitors 19, 18, and resistor 19 and operational amplifier 20, and inverter 35, also terminates at the summing junction 29.

The output signal available at 16, which represents the equivalent voltage generator signal Vp due to the strain of the piezoelectric material, is fed back to the power amplifier 31 after being processed in a processor 30 which translates the signal in accordance with a selected control function (called a control algorithm). The choice of control algorithm will depend on desired objectives of the structural control and can be of conventional design. For example, one may desire to control the position of the structure in which case one would choose position error control algorithms such as "Proportional Plus Integral Plus Derivative (PID)" or one may wish to reduce the vibration in the structure and would therefore choose a control algorithm such as "Velocity Feedback" which would allow active damping of the structure. This control algorithm could be implemented either by a digital or analog circuit as is conventional.

The self sensing actuator systems described in connection with FIGS. 5 and 6 function to measured strain within a piezoelectric device. Their circuits can be adapted for measuring stress by choosing a capacitance value for capacitor 17, which equals the internal constant stress capacitance value for the internal capacitance 2 of the piezoelectric device 3.

In order to adapt the self sensing actuator systems of FIGS. 5 and 6 for measuring rate of strain, the capacitors 18 and 9 are disconnected. The capacitor 17 is selected so that its capacitance equals the internal constant strain capacitance 2 of the device 3. The resistance of resistors 19 and 10 are selected such that the resulting device will provide a rate signal into the voltage follower operational amplifiers 11 and 20. The output signal at 16 will then be a rate of strain signal over the frequency of interest.

The system of FIGS. 5 and 6 can be adapted to sense and measure rate of stress, instead of rate of strain, by using a value for capacitor 17, which equals the internal constant stress value for capacitance of the piezoelectric device 3, and disconnecting capacitors 18 and 9.

Figure 7:
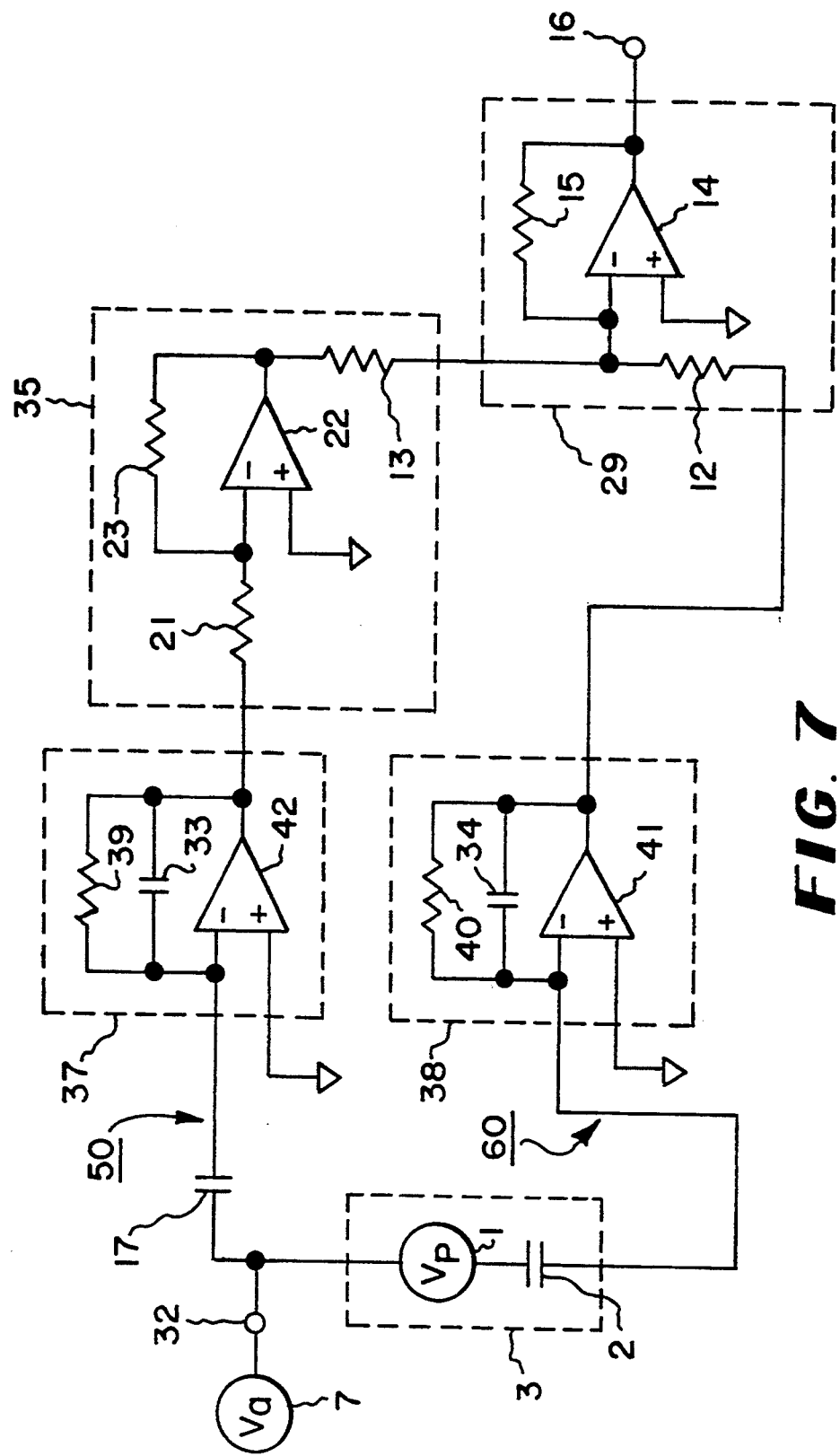
FIG. 7 is a schematic diagram of a dual function system, in accordance with still another embodiment of the invention, wherein charge amplifiers are used for voltage measurement.

Referring to FIG. 7, there is shown a self sensing actuator system in accordance with another embodiment of the invention which utilizes charge amplifiers 37 and 38. These are integrators and present high input impedance. Charge amplifier 37 is comprised of feedback capacitor 33, feedback resistor 39 and operational amplifier 42. Charge amplifier 38 is comprised of feedback capacitor 34, and feedback resistor 40 and operational amplifier 41.

When the system is to be strain responsive, the reference capacitor 17 is selected to be equal the constant strain capacitance of the piezoelectric device 3. The resistors 40 and 39 may be equal in resistance. They are chosen to define a 1/RC frequency with the feedback capacitors 33 and 34 which is large compared to the frequency of interest. For example if the Vp signal frequency produced by the piezoelectric device is 10 hertz then 1/RC should be greater than or equal to 100 hertz. The resistors 39 and 40 should not be so large that there is DC drift out of the operational amplifiers 41, 42. Suitable operational amplifiers 41, 42, 22, 14 are available from Motorola, their model number LM 348 N. Resistance values for resistors 21, 23, 13, 12, 15 are chosen to provide unity gains in the inverter 35 and the summer 29.

The output of the above mentioned circuit is available at 16, and will represent strain of the piezoelectric device 3. This output can be processed in a closed loop circuit utilizing a processor 30 having a control function or algorithms similar to those described in connection with FIG. 6, and can be applied to point 32 via a power amplifier similar to 31, as shown in FIG. 6.

The system of FIG. 7 may be used in a mode for sensing stress, instead of strain, by using a value for capacitor 17, which equals the constant stress value for the internal capacitance of the piezoelectric device 3.

A rate of strain sensing mode is provided by disconnecting capacitors 33 and 34. The resulting circuit will produce an output signal at 16 proportional to the rate of strain of the piezoelectric device 3.

A rate of stress, sensing mode, instead of strain, is obtained by using a value for capacitor 17, which equals the constant stress value of the internal capacitance of the piezoelectric device 3; the capacitors 33 and 34 also being disconnected.

In summary, the self sensing actuator system, in accordance with the invention, characterizes a piezoelectric actuator as containing both a signal due to actuation signal and a voltage due to the piezoelectric effect. These signals are separated in a circuit containing a reference and primary leg of equal impedance (a balanced bridge type circuit) wherein the primary leg contains the piezoelectric device, and whereby the two legs produce discrete voltage signals, the difference of which represents the piezoelectric effect. The piezoelectric effect is related to either the stress or strain of the device. Two legs having equal impedance will have equivalent phase and magnitude effect on the signals which pass through the legs, over the frequencies of interest.

It will be apparent to those skilled in the art that numerous other realizations of the herein described self sensing piezoelectric actuation system in both open and closed loop control applications and others were within the scope of the invention may be provided in accordance therewith for example with analog or digital circuitry, in software implementations and even with an integrated circuit chip. Accordingly, the foregoing description should be taken as illustrative and not in a limiting sense. Furthermore, this circuitry of the system may be realized in software, or in hardware, or on a chip.

What is claimed is:

1. A dual function system for producing a mechanical effect on a body and sensing a response thereto which comprises a piezoelectrically responsive element which both produces and senses mechanical effects, means for applying a first signal to said element for actuating said element to produce the mechanical effect on the body and for obtaining from said body via element piezoelectrically a second signal, and means for processing by additively combining said first and second signals for providing an output signal, said output signal representing the response of said element to said effect while said first signal is being applied.

2. The system according to claim 1 wherein said processing means includes means for processing said first and second signals for sensing the strain of the piezoelectric element on producing said effect so that said output signal corresponds to said strain.

3. The system according to claim 1 wherein said processing means includes means for processing said first and second signals for sensing the stress of the piezoelectric element in producing said effect so that said output signal corresponds to said stress.

4. The system according to claim 1 wherein said processing means includes means for processing said first and second signals so that said output signal corresponds to the rate of the stress of said element as said mechanical effect.

5. The system according to claim 1 wherein said processing means includes means for processing said first and second signals so that said output signal corresponds to the rate of strain of said element as said mechanical effect.

6. A dual function system for producing a mechanical effect and sensing a response thereto, which comprises a piezoelectrically responsive element, means for applying the first signal to said element for actuating said element to produce said effect and for obtaining a second signal in response to said effect, means for processing said first and second signals for providing an output signal, said output signal representing the response of said element to said effect, and further comprising means responsive to said output signal for generating said first signal.

7. A dual function system for producing a mechanical effect and sensing a response thereto, which comprises a piezoelectrically responsive element, means for applying the first signal to said element for actuating said element to produce said effect and for obtaining a second signal in response to said effect, means for processing said first and second signals for providing an output signal, said output signal representing the response of said element to said effect, and wherein said processing means comprises a bridge circuit having primary and reference legs, said element being connected in said primary leg, means in said primary and reference legs for respectively obtaining third and fourth signals of magnitude corresponding to the voltage across said element when said mechanical effect is a certain constant magnitude, and means for providing said output signals in accordance with the difference in said third and fourth signals when said first signal is applied to each of said legs.

8. The system according to claim 7 further comprising charge amplifiers in each of said legs.

9. The system according to claim 7 wherein said means for obtaining said third and fourth signals comprises a capacitor in said reference leg having a value corresponding to the internal capacitance of said element at a certain constant stress when said effect is stress.

10. The system according to claim 7 wherein said means for obtaining said third and fourth signals comprises a capacitor in said reference leg having a value corresponding to the internal capacitance of said element at a certain constant strain when said effect is strain.

11. The system according to claim 7 wherein said means for providing said third and fourth signals comprises a first capacitive voltage divider in said primary leg and a second capacitive voltage divider in said reference leg, said first and second dividers having in corresponding locations the internal capacitance of said element and a discrete capacitor having the value of said internal capacitance under said effect at said constant magnitude.

12. The system according to claim 7 wherein said difference providing means is connected at an output end of said legs and said first signal is applied at an input end of said legs, said input and output ends being opposite ends of said legs, and means responsive to said output signal for generating said first signal in accordance with a predetermined control function or algorithm.

13. A self sensing piezoelectric actuator system which produces stress or strain, which comprises a piezoelectric device having first and second electrodes and a body of piezoelectric material, a source of voltage, a connection between said first electrode on said piezoelectric device and said source so that a portion of said voltage appears at said second electrode, first means presenting a certain impedance corresponding to the impedance of said device when under a predetermined stress or strain, second means including said device and connected to said second electrode thereof which also presents said impedance, and third means, including said first and second means, responsive to said portion of said voltage for sensing stress or strain in said body of piezoelectric material.

14. The system according to claim 13 wherein said first and second means includes circuits presenting capacitive reactance which in said first means includes a capacitor presenting the same capacitance as said internal capacitance under said predetermined stress or strain.

15. The system according to claim 14 wherein said first and second means are reference and primary legs of a bridge circuit, and said third means includes a summing circuit.

16. The system according to claim 15 further comprising means connected to said summing circuit for providing said source of voltage.

* * * * *